United States Patent
Neuschaefer-Rube

(10) Patent No.: US 11,187,515 B2
(45) Date of Patent: Nov. 30, 2021

(54) ASSEMBLY AND METHOD FOR MEASURING A BENDING TORQUE ON A MACHINE ELEMENT

(71) Applicant: Schaeffler Technologies AG & Co. KG, Herzogenaurach (DE)

(72) Inventor: Stephan Neuschaefer-Rube, Herzogenaurach (DE)

(73) Assignee: Schaeffler Technologies AG & Co. KG, Herzogenaurach (DE)

( * ) Notice: Subject to any disclaimer, the term of this patent is extended or adjusted under 35 U.S.C. 154(b) by 59 days.

(21) Appl. No.: 16/626,069

(22) PCT Filed: May 17, 2018

(86) PCT No.: PCT/DE2018/100475
§ 371 (c)(1),
(2) Date: Dec. 23, 2019

(87) PCT Pub. No.: WO2019/001615
PCT Pub. Date: Jan. 3, 2019

(65) Prior Publication Data
US 2020/0209079 A1 Jul. 2, 2020

(30) Foreign Application Priority Data
Jun. 27, 2017 (DE) ...................... 10 2017 114 170.7

(51) Int. Cl.
*G01L 5/169* (2020.01)
*G01B 7/24* (2006.01)
*G01L 3/10* (2006.01)

(52) U.S. Cl.
CPC ................ *G01B 7/24* (2013.01); *G01L 3/102* (2013.01); *G01L 5/169* (2020.01)

(58) Field of Classification Search
CPC ............ G01B 7/24; G01L 5/169; G01L 3/102
See application file for complete search history.

(56) References Cited

U.S. PATENT DOCUMENTS

| | | | |
|---|---|---|---|
| 6,912,922 B2 | 7/2005 | Cheshmehdoost et al. | |
| 2005/0193834 A1* | 9/2005 | May | G01D 5/145 73/862.331 |
| 2009/0230953 A1* | 9/2009 | Lee | G01R 33/07 324/244 |
| 2014/0360282 A1 | 12/2014 | Gießibl | |

(Continued)

FOREIGN PATENT DOCUMENTS

| CN | 101598573 A | 12/2009 |
|---|---|---|
| CN | 105308424 A | 2/2016 |

(Continued)

*Primary Examiner* — Max H Noori
(74) *Attorney, Agent, or Firm* — Reid Baldwin

(57) ABSTRACT

An assembly measures a bending torque on a machine element extending on an axis using the inverse magnetostrictive effect. The machine element has a cavity and at least one magnetization region, extending circumferentially around the axis. A magnetic sensor is arranged in the cavity to measure a directional component of a magnetic field which is brought about by the magnetization and by the bending torque. A second directional component of the magnetic field may be measured by the magnetic sensor or by another magnetic sensor.

14 Claims, 3 Drawing Sheets

(56) References Cited

U.S. PATENT DOCUMENTS

| | | | |
|---|---|---|---|
| 2016/0146679 A1* | 5/2016 | Neuschaefer-Rube | ............... G01L 1/125 73/862.041 |
| 2017/0276556 A1* | 9/2017 | Neuschaefer-Rube | ............... H05K 1/111 |
| 2018/0073941 A1* | 3/2018 | Mock | ............... G01L 1/125 |
| 2018/0156676 A1* | 6/2018 | Neuschaefer-Rube | ............... G01L 3/102 |

FOREIGN PATENT DOCUMENTS

| | | |
|---|---|---|
| CN | 107110722 A | 8/2017 |
| DE | 69936138 T2 | 2/2008 |
| DE | 102013211000 A1 | 12/2014 |
| DE | 102013219761 B3 | 1/2015 |
| DE | 102014219336 B3 | 1/2016 |
| DE | 102015202239 B3 | 2/2016 |
| DE | 102015202240 B3 | 2/2016 |
| DE | 102015200268 B3 | 6/2016 |
| EP | 1906292 A1 | 4/2008 |
| WO | 2011085400 A1 | 7/2011 |

\* cited by examiner

ASSEMBLY AND METHOD FOR MEASURING A BENDING TORQUE ON A MACHINE ELEMENT

CROSS-REFERENCE TO RELATED APPLICATIONS

This application is the U.S. National Phase of PCT Appln. No. PCT/DE2018/100475 filed May 17, 2018, which claims priority to DE 10 2017 114 170.7 filed Jun. 27, 2017, the entire disclosures of which are incorporated by reference herein.

TECHNICAL FIELD

The present disclosure relates to an assembly for measuring a bending moment on a machine element extending on an axis using the inverse magnetostrictive effect. The machine element has at least one magnetization region, extending circumferentially around the axis, for a magnetization. The disclosure furthermore relates to a method for measuring a bending moment with the aid of the assembly.

BACKGROUND

WO 2011/085400 A1 shows a magnetoelastic force sensor by means of which mechanical loads on an element can be measured. The element has a tangentially encircling magnetization and is subject to a bending moment. A magnetic field sensor is situated in a central plane. According to the illustration in FIG. 1(b) of WO 2011/085400 A1, the magnetic field sensor can be situated in the element.

DE 10 2015 202 240 B3 shows an assembly for measuring a force and/or a moment on a machine element extending on an axis using the inverse magnetostrictive effect. The assembly comprises at least three magnetic field sensors, which may also be situated within a cavity of the machine element.

DE 699 36 138 T2 shows a magnetic force sensor in which a magnetized material is subjected to a bending moment, wherein the external magnetic field of the magnetized material can be determined with the aid of a sensor assembly.

DE 10 2014 219 336 B3 teaches a method and an assembly for measuring a force and/or a moment on a machine element extending on an axis using the inverse magnetostrictive effect. Some embodiments of this assembly allow simultaneous measurement of bending moments and torques as well as transverse forces. The assembly comprises at least two magnetic field sensors, which may also be situated within a cavity of the machine element.

DE 10 2015 202 239 A1 shows an assembly for measuring a force or a moment on a machine element using the inverse magnetostrictive effect. The machine element has a cavity in which there are at least two magnetic field sensors.

US 2014/0360282 A1 teaches a magnetoelastic sensor having a shaft-like element extending in the longitudinal direction. The shaft-like element is subjected to a mechanical load and has a magnetoelastically active region, into which the mechanical load is transferred, with the result that this region is shaped helically. A magnetic field sensor device is arranged close to the magnetoelastic region and is designed to determine a sheer stress and/or a tensile or compressive stress. In particular, the sensor device comprises at least one directional magnetic field sensor, which is arranged in a predetermined spatial orientation relative to the shaft-like element. The magnetic field sensor is situated in a cavity of the shaft-like element.

SUMMARY

It is desirable to reduce the outlay for measurement based on the inverse magnetostrictive effect of a bending moment acting on a machine element.

An assembly is used to measure a bending moment on a machine element extending in the direction of an axis. The bending moment acts on the machine element, as a result of which mechanical stresses occur and the machine element is generally slightly deformed. The axis may form an axis of rotation of the machine element. The axis defines a radial direction, a tangential or circumferential direction and an axial direction, which are oriented perpendicularly to one another.

The bending moment has a bending moment axis, which represents an axis of rotation of the bending moment. The bending moment axis may be arranged perpendicularly to the axis of the machine element. The bending moment axis may intersect the axis of the machine element.

The machine element has a cavity and is therefore hollow. The cavity may extend in the direction of the axis. The axis may be arranged at least partially in the cavity.

The machine element has at least one magnetization region, extending circumferentially around the axis, for a magnetization formed in the machine element. This is therefore a magnetization region encircling the axis, i.e. a circular magnetization region, wherein the axis itself preferably does not form part of the magnetization region. The magnetization region has a tangential orientation in relation to a machine element surface extending around the axis. The magnetization region preferably has only a tangential orientation in relation to a machine element surface extending around the axis. The magnetization region preferably extends along a continuous path around the axis, wherein the magnetization region can have short gaps. The magnetization region is preferably formed in an axial section of the machine element. The magnetization region forms a primary sensor for determining the bending moment.

The assembly furthermore comprises at least one magnetic field sensor, which forms a secondary sensor for determining the bending moment. The primary sensor, i.e. the at least one magnetization region, is used to convert the bending moment to be measured into a corresponding magnetic field, while the secondary sensor allows conversion of this magnetic field into an electric signal.

The at least one magnetic field sensor is designed for measuring at least one individual directional component of a magnetic field brought about by the magnetization and by the bending moment. Said magnetic field arises because of the inverse magnetostrictive effect. Thus, the measurement that is possible with the assembly according to the invention is based on the inverse magnetostrictive effect.

The at least one magnetic field sensor is arranged in the cavity of the machine element. Thus, the at least one magnetic field sensor is arranged opposite an inner surface inside the machine element.

According to the invention, the magnetic field sensor is arranged in such a way that it is spaced apart from a straight line which intersects the axis perpendicularly, is oriented in the radial direction and is oriented parallel to the directional component, measurable with the magnetic field sensor, of the magnetic field brought about by the magnetization and by the bending moment. Moreover, the magnetic field sensor is arranged in such a way that it is spaced apart from a straight line which intersects the axis perpendicularly, is oriented in the radial direction and is oriented perpendicularly to the directional component, measurable with the magnetic field sensor, of the magnetic field brought about by the magnetization and by the bending moment. The at least one magnetic field sensor is preferably arranged spaced apart from the axis in the cavity. Since the at least one magnetic field sensor according to the invention can be arranged at any desired location in the cavity, it is preferably arranged where it can be installed with little effort. This can be at a location close to the inner surface of the machine element at a significant distance from the axis, for example.

One particular advantage of the assembly is that the at least one magnetic field sensor can be arranged at any desired location in the cavity of the machine element and allows measurement of the bending moment.

The at least one magnetic field sensor is preferably arranged at an axial position in which the magnetization region is formed. The at least one magnetic field sensor is preferably arranged axially at a central axial position of the magnetization region.

In some embodiments of the assembly, the at least one magnetic field sensor is designed for measuring the at least one individual directional component of the magnetic field brought about by the magnetization and by the bending moment, wherein said at least one directional component is in a plane perpendicular to the axis. Thus, this directional component is at least parallel to a straight line oriented in the radial direction, i.e. at least parallel to a radius emanating from the axis.

In some embodiments of the assembly, the at least one magnetic field sensor is designed for measuring the at least one individual directional component of the magnetic field brought about by the magnetization and by the bending moment, wherein said at least one directional component is oriented parallel to the bending moment axis of the bending moment.

In some embodiments of the assembly, the at least one magnetic field sensor is designed for measuring the at least one individual directional component of the magnetic field brought about by the magnetization and by the bending moment, wherein said at least one directional component is in a plane perpendicular to the axis, and wherein said at least one directional component is oriented parallel to the bending moment axis of the bending moment.

In a first embodiment, the assembly comprises the precisely one magnetic field sensor, which is designed for measuring the precisely one individual directional component of the magnetic field brought about by the magnetization and by the bending moment. This directional component is in a plane perpendicular to the axis and is oriented parallel to the bending moment axis of the bending moment. The magnetic field sensor is arranged spaced apart from the axis in the cavity.

In a second embodiment, the assembly comprises the precisely one magnetic field sensor, which is designed for measuring the precisely two individual directional components of the magnetic field brought about by the magnetization and by the bending moment, wherein these two directional components are oriented perpendicularly to one another. These directional components are in a plane perpendicular to the axis, wherein one of the two directional components is preferably oriented parallel to the bending moment axis of the bending moment. The magnetic field sensor is arranged spaced apart from a straight line which intersects the axis perpendicularly and is oriented parallel to the first of the two directional components. The magnetic field sensor is arranged spaced apart from a straight line which intersects the axis perpendicularly and is oriented parallel to the second of the two directional components. The magnetic field sensor is arranged spaced apart from a straight line which intersects the axis perpendicularly and is oriented perpendicularly to the first of the two directional components. The magnetic field sensor is arranged spaced apart from a straight line which intersects the axis perpendicularly and is oriented perpendicularly to the second of the two directional components. The magnetic field sensor is arranged spaced apart from the axis in the cavity.

In a third embodiment, the assembly comprises two of the magnetic field sensors, each of which is designed for measuring an individual directional component of the magnetic field brought about by the magnetization and by the bending moment, wherein the directional component that can be measured with a first of the two magnetic field sensors and the directional component that can be measured with a second of the two magnetic field sensors are oriented perpendicularly to one another. These two directional components are in a plane perpendicular to the axis, wherein one of the two directional components may be oriented parallel to the bending moment axis of the bending moment. The first of the two magnetic field sensors is arranged spaced apart from a straight line which intersects the axis perpendicularly and is oriented parallel to the directional component that can be measured with the first magnetic field sensor. The first magnetic field sensor is arranged spaced apart from a straight line which intersects the axis perpendicularly and is oriented perpendicularly to the directional component that can be measured with the first magnetic field sensor. The second of the two magnetic field sensors is arranged spaced apart from a straight line which intersects the axis perpendicularly and is oriented parallel to the directional component that can be measured with the second magnetic field sensor. The second magnetic field sensor is arranged spaced apart from a straight line which intersects the axis perpendicularly and is oriented perpendicularly to the directional component that can be measured with the second magnetic field sensor. The magnetic field sensors are arranged spaced apart from the axis in the cavity. The axial position of the two magnetic field sensors is preferably the same.

In further embodiments of the assembly, the machine element has at least two of the magnetization regions, each for one magnetization, extending circumferentially around the axis. The magnetizations of the at least two magnetization regions extending around the axis preferably have alternating polarities, i.e. they circulate in opposite directions to one another. Apart from their polarity, the magnetization regions are preferably the same. The machine element furthermore preferably has at least one magnetically neutral section, which is arranged axially between two adjacent magnetization regions.

The at least one magnetization region can be permanently or temporarily magnetized. In some embodiments of the assembly, the at least one magnetization region is permanently magnetized, and therefore the magnetization is formed by a permanent magnetization. In other embodiments of the assembly, said assembly furthermore has at least one magnet for magnetizing the at least one magnetization region, and therefore the magnetization of the magnetization region is fundamentally temporary. The at least one magnet can be formed by at least one permanent magnet or preferably by an electromagnet.

In a state of the machine element not subject to load from a force or a moment, the at least one permanently or temporarily magnetized magnetization region is preferably magnetically neutral with respect to the outside of the magnetization region, and therefore no technically relevant magnetic field can then be measured outside the magnetization region.

The at least one permanently or temporarily magnetized magnetization region is preferably formed in a machine element section of magnetoelastic design. In the machine element section of magnetoelastic design, the machine element may be composed of a magnetostrictive material. The at least one magnetization region preferably has a high magnetostrictivity. It is preferable if not just one section but the machine element as such is of magnetoelastic design. In this case, the machine element is composed of a magnetostrictive material, in particular of a magnetostrictive steel.

The at least one magnetization region forms a part of the volume of the machine element. The magnetization region may be of annular design, wherein the axis of the machine element also forms a central axis of the annular shape. The magnetization region may have the shape of a hollow cylinder coaxial with the axis of the machine element.

The machine element may have the shape of a hollow prism or of a hollow cylinder, wherein the hollow prism or the hollow cylinder is arranged coaxially with the axis. The hollow prism or hollow cylinder may be a right prism or cylinder. The machine element may have the shape of a circular right hollow cylinder which is arranged coaxially with the axis. In some embodiments, the hollow prism or the hollow cylinder is of conical design.

The machine element may be formed by a hollow shaft, by a hollow selector fork, by a sleeve or by a hollow flange. The hollow shaft, the hollow selector fork, the sleeve or the hollow flange can be designed for loads due to different forces and moments and, for example, can be a component of a sensor bottom bracket bearing, of a roll stabilizer or of a fertilizer spreader. In principle, the machine element can also be formed by hollow machine element types of a completely different type.

The at least one magnetic field sensor may be formed by a semiconductor sensor. Alternatively, the at least one magnetic field sensor may be formed by a Hall-effect sensor, by a coil, by a Förster probe or by a fluxgate magnetometer. In principle, it is also possible to use other types of sensor if they are suitable for the individual measurement of a directional component of the magnetic field caused by the inverse magnetostrictive effect.

The method is used to measure a bending moment acting on the machine element of the assembly. In one step of the method, at least one measurement signal from the at least one magnetic field sensor is received. In a further step, the bending moment to be measured is determined in accordance with the measurement signal. This dependence can be determined in advance by means of a series of measurements, for example.

The method may be used to measure a bending moment acting on the machine element of one of the embodiments of the assembly which have been described. Moreover, the method may also have features which are indicated in connection with the assembly.

The method may be used to measure a bending moment acting on the machine element of the second embodiment of the assembly which has been described above. In one step, a first measurement signal and a second measurement signal of the magnetic field sensor measuring two directional components of the magnetic field brought about by the magnetization and by the bending moment are received. Moreover, a first directional component of the bending moment is determined in accordance with the first measurement signal. Furthermore, a second directional component of the bending moment is determined in accordance with the second measurement signal. The two directional components of the bending moment are perpendicular to one another. It is thus possible to determine an angular position of the bending moment, for example.

The method may be used to measure a bending moment acting on the machine element of the third embodiment of the assembly which has been described above. In one step, a first measurement signal from a first of the two magnetic field sensors is received. In a further step, a second measurement signal from a second of the two magnetic field sensors is received. Moreover, a first directional component of the bending moment is determined in accordance with the first measurement signal. Furthermore, a second directional component of the bending moment is determined in accordance with the second measurement signal. The two directional components of the bending moment are perpendicular to one another. It is thus possible to determine an angular position of the bending moment, for example.

BRIEF DESCRIPTION OF THE DRAWINGS

Further details, advantages and developments will become apparent from the following description of embodiments with reference to the drawing. In the drawing.

DETAILED DESCRIPTION

Figure 1:
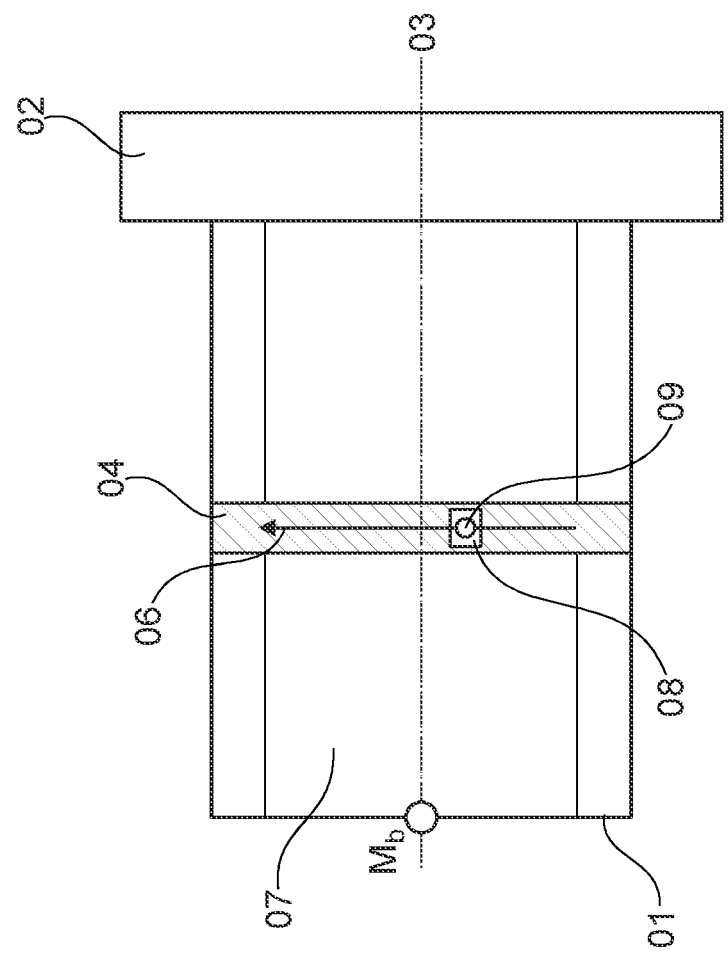
FIG. 1 shows a first embodiment of an assembly for single-axis measurement of a bending moment.
Figure 1:
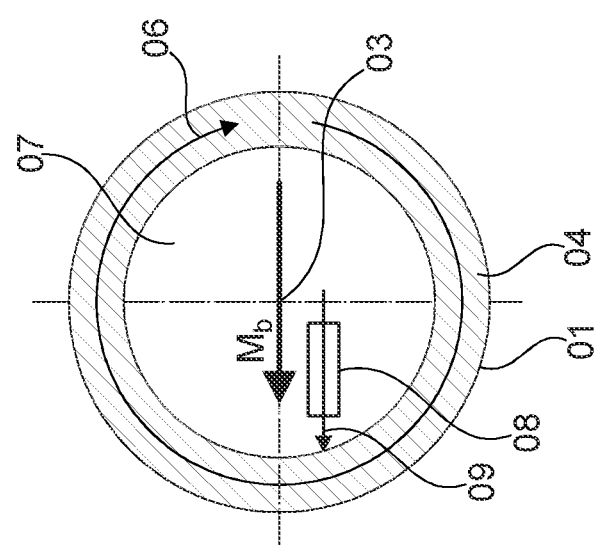
Figure 2:
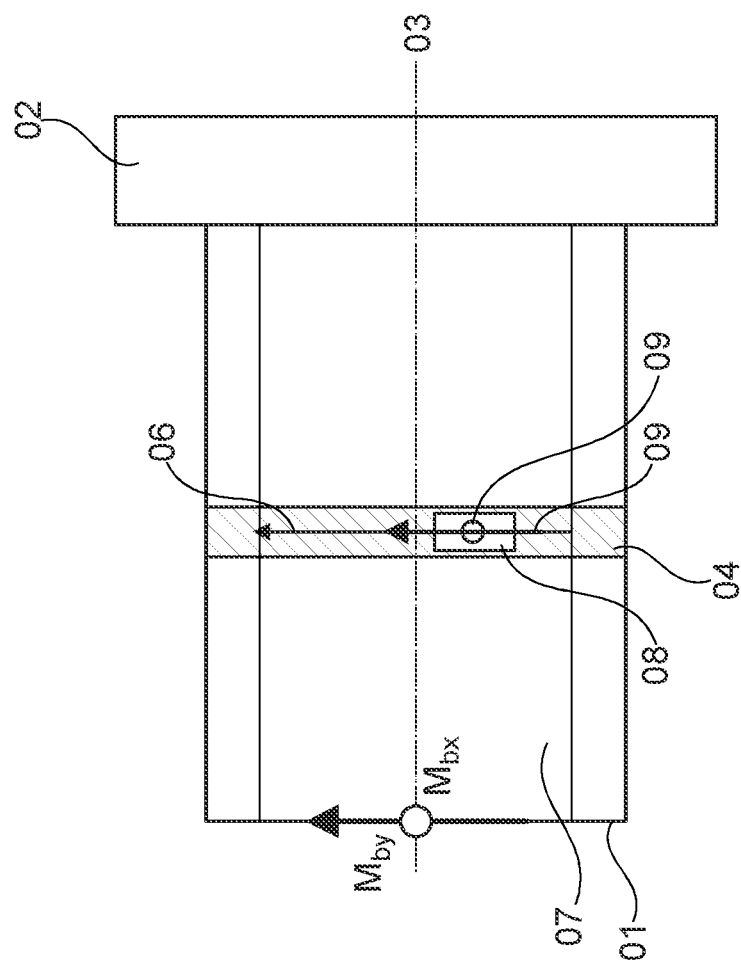
FIG. 2 shows a second embodiment of the assembly for two-axis measurement of a bending moment.
Figure 2:
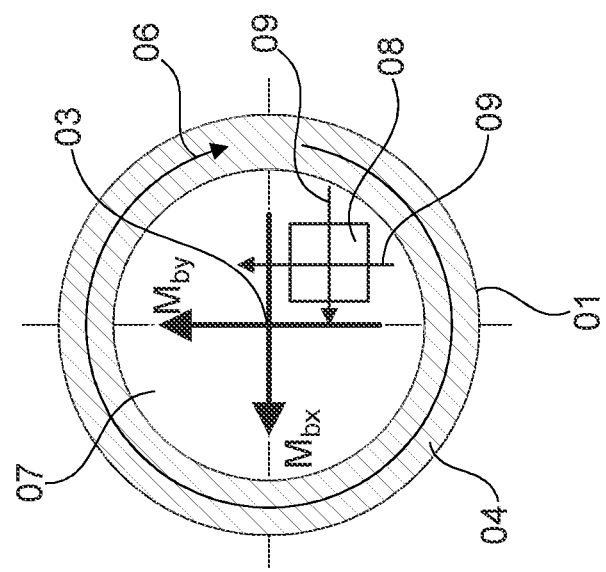
Figure 3:
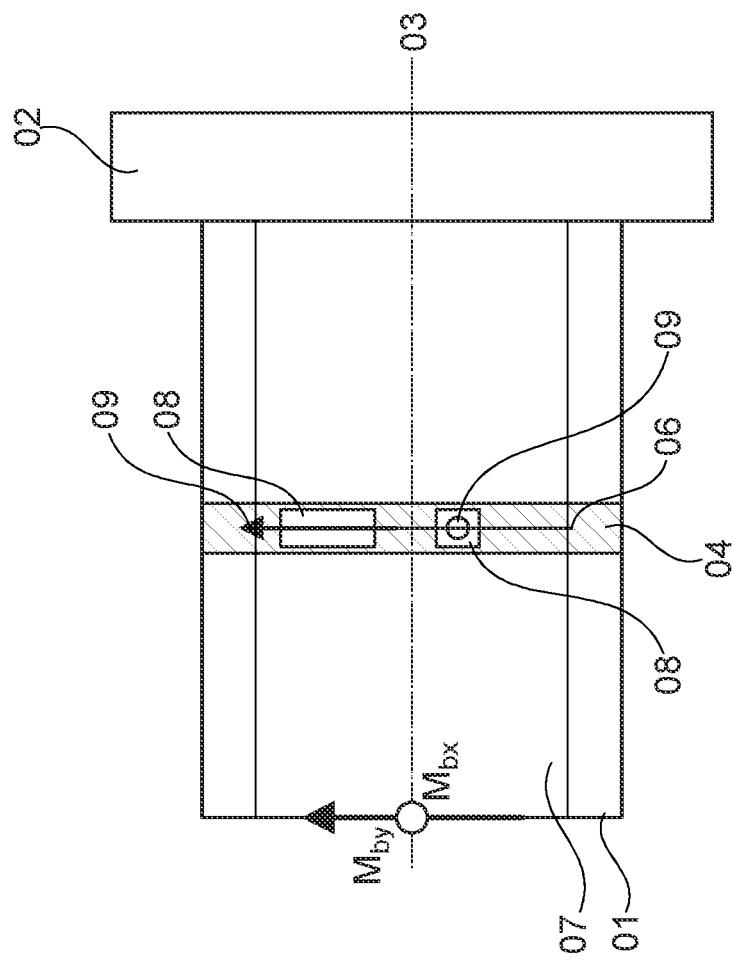
FIG. 3 shows a third embodiment of the assembly for two-axis measurement of a bending moment.
Figure 3:
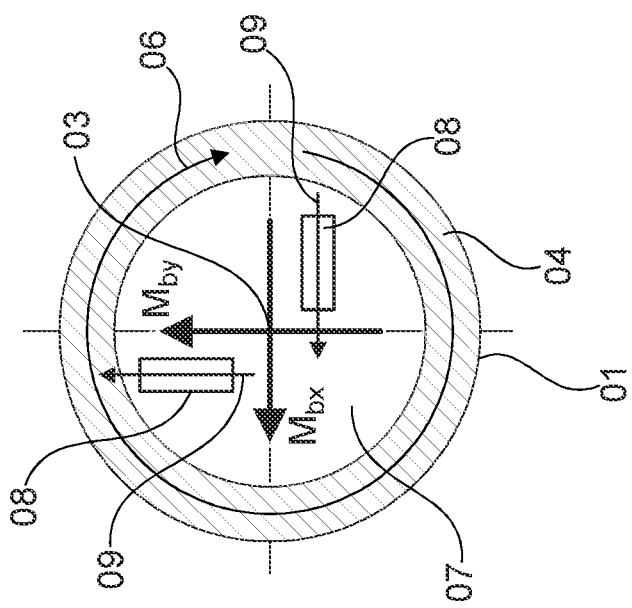

FIG. 1 to FIG. 3 show an assembly, in each case in two views. The left-hand parts of the figures each comprise a cross-sectional view, while the right-hand parts of the figures each comprise a plan view of the assembly.

FIG. 1 shows a first embodiment of the assembly, which is used for single-axis measurement of a bending moment $M_b$. The assembly first of all comprises a machine element in the form of a hollow flange 01, which is secured on a main body 02. The hollow flange 01 has the shape of a hollow circular cylinder. The hollow flange 01 extends on an axis 03, which also forms the central axis of the hollow cylinder shape of the hollow flange 01. In particular, the hollow flange 01 is subjected to bending stress by the bending moment $M_b$. The hollow flange 01 is composed of a magnetoelastic material, which has the inverse magnetostrictive effect.

A permanent magnetization region 04, which encircles the axis 03, is formed in an axial section of the hollow flange 01; that is to say this is a circular permanent magnetization with a directional sense 06 illustrated by an arrow. Axially on both sides of the permanent magnetization region 04, the hollow flange 01 is not magnetized.

Since the hollow flange 01 is hollow, it has a cavity 07. The cavity 07 has the shape of a cylinder which is arranged coaxially with the axis 03. In the cavity 07 there is a magnetic field sensor 08, which has an axial position that is the same as the permanent magnetization region 04. The magnetic field sensor 08 is arranged spaced apart from the axis 03 since, according to the invention, it can be arranged at any desired location in the cavity 07. The magnetic field sensor 08 is designed for individual measurement of a directional component 09, illustrated by an arrow, of a magnetic field brought about by the permanent magnetization of the permanent magnetization region 04 and by the bending moment $M_b$ by virtue of the inverse magnetostrictive effect. This directional component 09 is in a plane oriented perpendicularly to the axis 03. This directional component 09 is furthermore oriented parallel to a vector of the bending moment $M_b$.

FIG. 2 shows a second embodiment of the assembly, which initially resembles the embodiment shown in FIG. 1. In contrast to the embodiment shown in FIG. 1, the magnetic field sensor 08 is designed for the individual measurement of each of two of the directional components 09, each illustrated by an arrow, which are oriented perpendicularly to one another. As a result, a directional component $M_{bx}$ of the bending moment $M_b$ and a directional component $M_{by}$ of the bending moment $M_b$ can be determined individually.

FIG. 3 shows a third embodiment of the assembly, which initially resembles the embodiment shown in FIG. 1. In contrast to the embodiment shown in FIG. 1, the embodiment shown in FIG. 3 comprises two of the magnetic field sensors 08, wherein the directional components 09 of the magnetic field brought about by the permanent magnetization of the permanent magnetization region 04 and by the bending moment $M_b$ by virtue of the inverse magnetostrictive effect, which components can each be measured individually by the two magnetic field sensors 08, are oriented perpendicularly to one another. Thus, as in the embodiment shown in FIG. 2, the directional component $M_{bx}$ of the bending moment $M_b$ and the directional component $M_{by}$ of the bending moment $M_b$ can be determined individually.

LIST OF REFERENCE SIGNS 01 hollow flange
02 main body
03 axis
04 permanent magnetization region
05 -
06 directional sense
07 cavity
08 magnetic field sensor
09 directional component

The invention claimed is:

1. An assembly for measuring a bending moment comprising:
a machine element extending on an axis, wherein the machine element has a cavity and at least one magnetization region extending circumferentially around the axis; and
at least one magnetic field sensor, which is arranged in the cavity and is designed for measuring at least one individual directional component of a magnetic field brought about by the magnetization and by the bending moment; wherein
the magnetic field sensor is arranged spaced apart from a first straight line which intersects the axis perpendicularly and is oriented parallel to the directional component; and
the magnetic field sensor is arranged spaced apart from a second straight line which intersects the axis perpendicularly and is oriented perpendicularly to the directional component.

2. The assembly of claim 1, wherein the at least one magnetic field sensor is arranged at an axial position in which the magnetization region is formed.

3. The assembly of claim 1, wherein the at least one directional component is in a plane perpendicular to the axis.

4. The assembly of claim 1, having precisely one magnetic field sensor, which is designed for measuring precisely one directional component of the magnetic field brought about by the magnetization and by the bending moment.

5. The assembly of claim 1, having precisely one magnetic field sensor, which is designed for measuring two directional components of the magnetic field oriented perpendicularly to one another.

6. The assembly of claim 1, having precisely two magnetic field sensors, each of which is designed for measuring the individual directional component of the magnetic field brought about by the magnetization and by the bending moment, wherein the directional component that can be measured with one of the two magnetic field sensors and the directional component that can be measured with the other of the two magnetic field sensors are oriented perpendicularly to one another.

7. A method for measuring a bending moment by means of an assembly as claimed in claim 1, comprising steps:
receiving at least one measurement signal from the at least one magnetic field sensor; and
determining the bending moment in accordance with the measurement signal.

8. A method for measuring a bending moment by means of an assembly as claimed in claim 5, comprising:
receiving a first measurement signal and a second measurement signal from the magnetic field sensor measuring the two directional components;
determining a first directional component of the bending moment in accordance with the first measurement signal; and
determining a second directional component of the bending moment in accordance with the second measurement signal.

9. A method for measuring a bending moment by means of an assembly as claimed in claim 6, comprising:
receiving a first measurement signal from a first of the two magnetic field sensors;
receiving a second measurement signal from a second of the two magnetic field sensors;
determining a first directional component of the bending moment in accordance with the first measurement signal; and
determining a second directional component of the bending moment in accordance with the second measurement signal.

10. The assembly of claim 1 wherein the at least one magnetization region establishes a magnetic field extending circumferentially around the axis.

11. An assembly for measuring a bending moment comprising:
a hollow shaft extending on an axis and having a magnetization region extending circumferentially around the axis; and
a first magnetic field sensor arranged in an interior of the hollow shaft and configured to measure a first directional component of a magnetic field brought about by the magnetization and by the bending moment; wherein
the first magnetic field sensor is axially aligned with the magnetization region;
the first magnetic field sensor is offset from a first straight line which intersects the axis perpendicularly and is oriented parallel to the first directional component; and
the first magnetic field sensor is offset from a second straight line which intersects the axis perpendicularly and is oriented perpendicularly to the first directional component.

12. The assembly of claim 11 wherein the magnetization region establishes a magnetic field extending circumferentially around the axis.

13. The assembly of claim 12, wherein the first magnetic field sensor is further configured to measure a second directional components of the magnetic field oriented perpendicularly to the first directional component.

14. The assembly of claim 12, further comprising:
a second magnetic field sensor arranged in the interior of the hollow shaft and configured to measure a second directional component of a magnetic field perpendicular to the first directional component; wherein
the second magnetic field sensor is axially aligned with the magnetization region;
the second magnetic field sensor is offset from the first straight line; and
the second magnetic field sensor is offset from the second straight line.

* * * * *